United States Patent
Watanabe

(10) Patent No.: US 12,041,743 B2
(45) Date of Patent: *__Jul. 16, 2024__

(54) FACEPLATE AND ELECTRONIC DEVICE

(71) Applicant: FANUC CORPORATION, Yamanashi (JP)

(72) Inventor: Hitoshi Watanabe, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 38 days.

This patent is subject to a terminal disclaimer.

(21) Appl. No.: 16/787,082

(22) Filed: Feb. 11, 2020

(65) Prior Publication Data
US 2020/0260606 A1   Aug. 13, 2020

(30) Foreign Application Priority Data

Feb. 13, 2019   (JP) ................................. 2019-023819

(51) Int. Cl.
*H05K 7/14*   (2006.01)

(52) U.S. Cl.
CPC ......... *H05K 7/1404* (2013.01); *H05K 7/1405* (2013.01); *H05K 7/1415* (2013.01)

(58) Field of Classification Search
CPC .. H05K 7/1402; H05K 7/1404; H05K 7/1405; H05K 7/1415; H05K 5/023; H05K 5/0239
USPC ........................................................ 361/801
See application file for complete search history.

(56) References Cited

U.S. PATENT DOCUMENTS

| | | | |
|---|---|---|---|
| 4,840,570 A | | 6/1989 | Mann, Jr. et al. |
| 4,875,867 A | * | 10/1989 | Hoo ................. H01R 13/62933 439/157 |
| 5,277,615 A | | 1/1994 | Hastings et al. |
| 5,685,741 A | * | 11/1997 | Dewey ................. H04Q 1/023 439/668 |
| 6,128,196 A | | 10/2000 | Hoyle, Jr. et al. |
| 6,195,262 B1 | | 2/2001 | Bodette et al. |
| 6,198,633 B1 | | 3/2001 | Lehman et al. |

(Continued)

FOREIGN PATENT DOCUMENTS

| | | |
|---|---|---|
| CN | 2678317 Y | 2/2005 |
| CN | 1735324 A | 2/2006 |

(Continued)

OTHER PUBLICATIONS

Office Action issued in U.S. Appl. No. 16/787,093 dated Dec. 24, 2021 (13 pages).

(Continued)

*Primary Examiner* — Zhengfu J Feng
(74) *Attorney, Agent, or Firm* — Robert P. Michal, Esq.; Carter, DeLuca & Farrell LLP

(57) ABSTRACT

A faceplate that is attached to a circuit board on the side of an extraction direction in which the circuit board is extracted from a slot includes: a main body that covers an opening of the slot; and two handle portions that are disposed respectively at both ends of the main body with respect to a width direction of the circuit board and that extend in the extraction direction. The two handle portions have respective distal ends shifted from each other in a thickness direction of the circuit board. Multiple slots are formed in a casing of an electronic device along a width direction thereof.

15 Claims, 8 Drawing Sheets

(56) References Cited

U.S. PATENT DOCUMENTS

| | | |
|---|---|---|
| 6,288,911 B1 | 9/2001 | Aoki et al. |
| 6,359,789 B1 | 3/2002 | Imabayashi et al. |
| 6,744,633 B1 | 6/2004 | Dials et al. |
| 6,879,495 B2 | 4/2005 | Jiang |
| 7,023,704 B1 | 4/2006 | Zarnowitz et al. |
| 7,238,893 B2 | 7/2007 | Hensley et al. |
| 7,453,706 B2 | 11/2008 | Clark et al. |
| 8,760,875 B2 | 6/2014 | Knight et al. |
| 9,326,416 B1 | 4/2016 | Xu et al. |
| 9,723,745 B2 | 8/2017 | Qi et al. |
| 10,178,807 B2 | 1/2019 | Conn et al. |
| 10,264,701 B1 | 4/2019 | Norton |
| 10,277,015 B2 | 4/2019 | Choi |
| 10,285,291 B1 | 5/2019 | Lam et al. |
| 10,455,721 B2 | 10/2019 | Miura |
| 10,528,093 B1 | 1/2020 | Erie |
| 2004/0031767 A1 | 2/2004 | Ice |
| 2006/0087801 A1* | 4/2006 | Champion ............... G06F 1/185 361/679.41 |
| 2007/0081315 A1* | 4/2007 | Mondor ................ H04Q 1/116 361/788 |
| 2010/0244641 A1 | 9/2010 | Bergesch et al. |
| 2012/0120596 A1 | 5/2012 | Bechtolsheim |
| 2013/0230998 A1 | 9/2013 | Pav et al. |
| 2016/0050795 A1* | 2/2016 | Conn ................ H05K 7/20736 454/184 |
| 2017/0118861 A1* | 4/2017 | Miwa ................... H05K 7/1455 |
| 2017/0290190 A1 | 10/2017 | Lindquist et al. |
| 2018/0168061 A1 | 6/2018 | Liao |

FOREIGN PATENT DOCUMENTS

| | | |
|---|---|---|
| CN | 2819288 Y | 6/2006 |
| CN | 103298674 A | 9/2013 |
| CN | 103576608 A | 2/2014 |
| CN | 204272526 U | 4/2015 |
| CN | 205304621 U | 6/2016 |
| CN | 105930610 A | 9/2016 |
| CN | 107564427 A | 1/2018 |
| CN | 208294297 U | 12/2018 |
| JP | H07288154 A | 10/1995 |
| JP | 2011-071396 A | 4/2011 |
| JP | 2016054266 A | 4/2016 |
| JP | 2017139094 A | 8/2017 |
| TW | 461624 U | 10/2001 |

OTHER PUBLICATIONS

Wang Chunlin, "Research on digital image encryption algorithm based on chaos theory", May 2014, Dissertion submitted to the Graduate School of Henan University, 63 pages (including English abstract).

Chen Junwei, "Research and implementation of universal automatic test platform for data converter based on FPGA", Jan. 2016; thesis submitted to Xidian University, 100 pages (including English abstract).

Final Office Action issued by the United States Patent and Trademark Office in relation to U.S. Appl. No. 16/787,093 dated May 17, 2022, 8 pages.

German Office Action dated May 28, 2024, issued in corresponding German Patent Appln. No. 102020103254.4, 9 pages.

* cited by examiner

FIG. 3
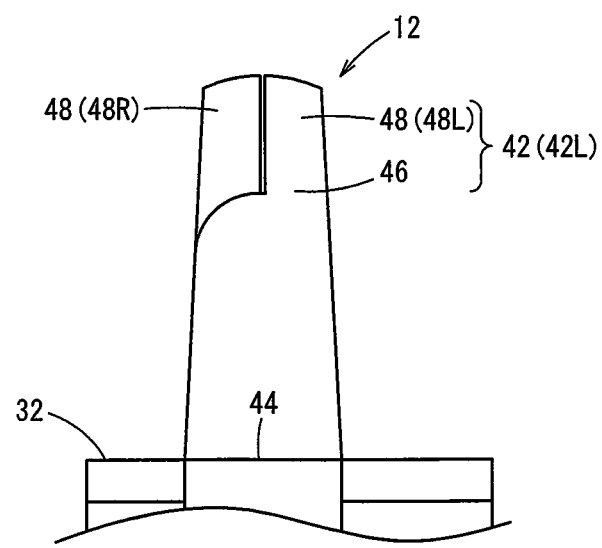
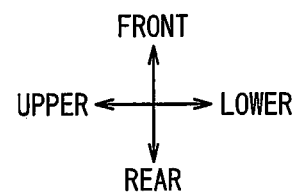

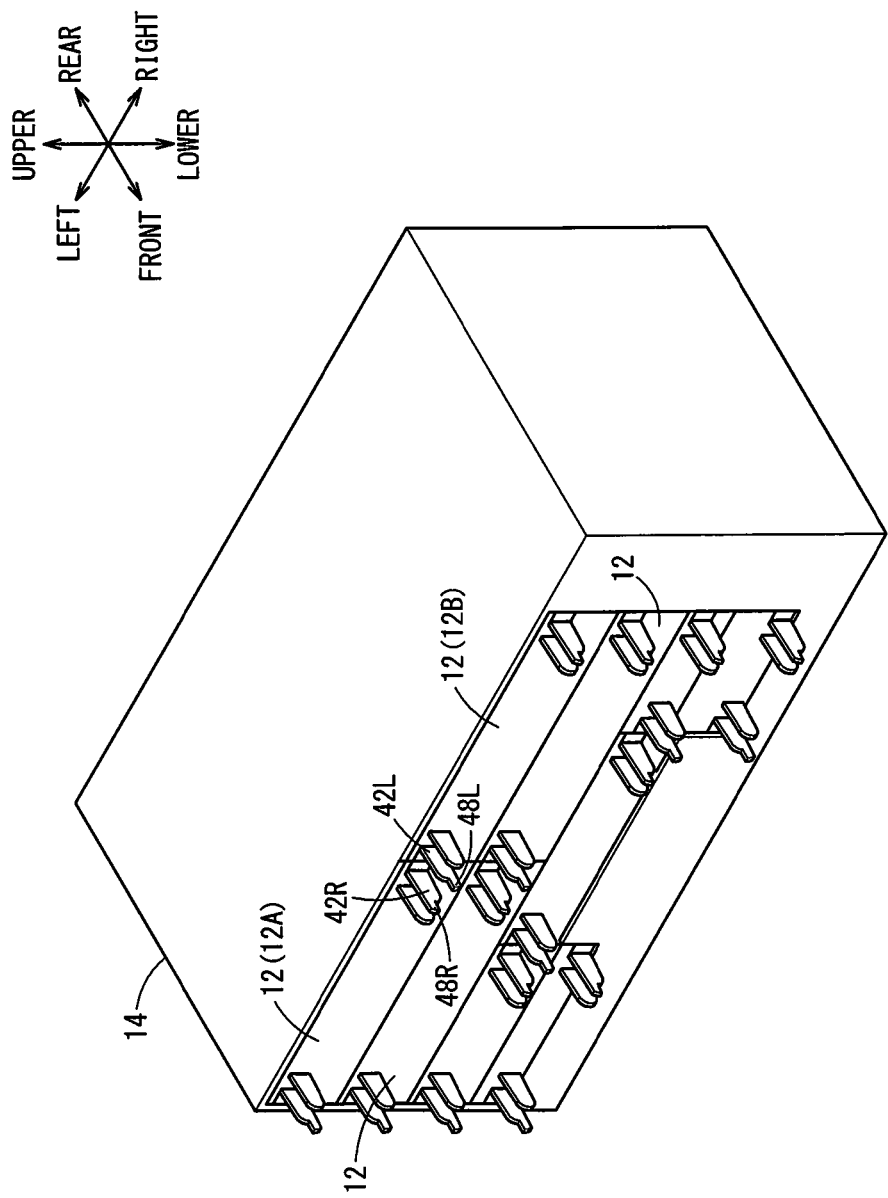

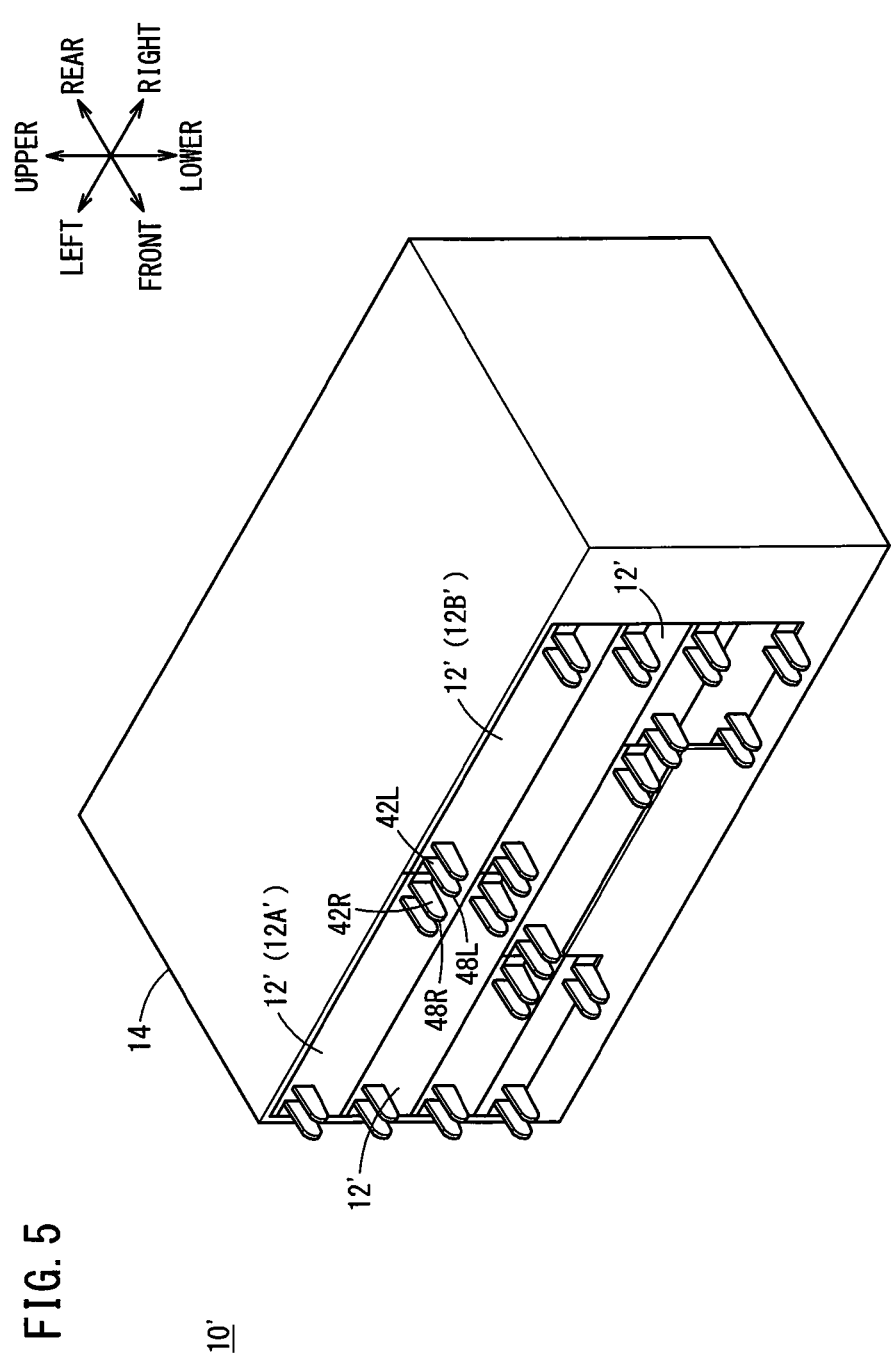

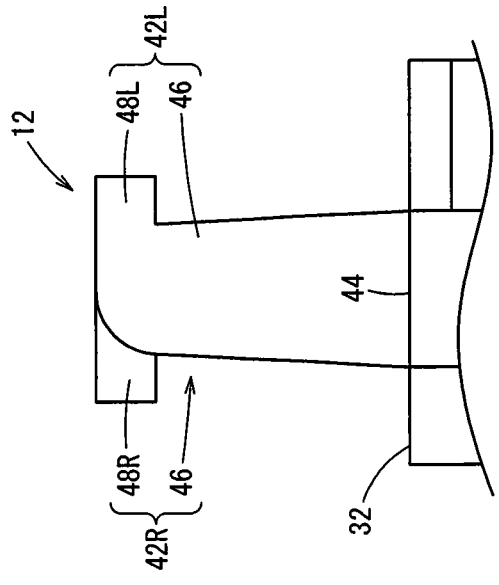
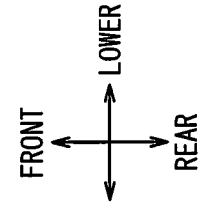
FIG. 6A
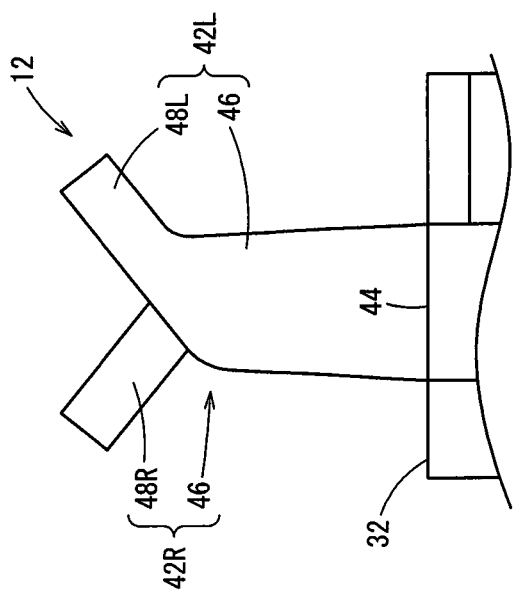
FIG. 6B

FACEPLATE AND ELECTRONIC DEVICE

CROSS-REFERENCE TO RELATED APPLICATION

This application is based upon and claims the benefit of priority from Japanese Patent Application No. 2019-023819 filed on Feb. 13, 2019, the contents of which are incorporated herein by reference.

BACKGROUND OF THE INVENTION

Field of the Invention

The present invention relates to a faceplate and an electronic device.

Description of the Related Art

Electronic devices having slots in which circuit boards can be inserted are generally known. As disclosed in Japanese Laid-Open Patent Publication No. 2011-071396, some of such electronic devices have faceplates that cover the openings of the slots when the circuit boards are inserted in the slots.

SUMMARY OF THE INVENTION

The number of slots provided in one electronic device is increasing as multifunctionality of electronic devices advances. Further, for electronic devices having multiple slots, there is a tendency to arrange two adjacent slots at shorter intervals as the electronic devices are downsized. A shorter interval between two slots causes a shorter interval between the faceplates that cover the two slots.

Some faceplates are provided with handles (or knobs or the like) for allowing the operator to hold the faceplate when removing it from the electronic device. However, when the operator attempts to hold the handles of a faceplate to remove it, neighboring other handles may interfere if the two adjacent faceplates are disposed at a short interval.

Accordingly, an object of the present invention is to provide a faceplate that has handle portions that can be easily held even if multiple faceplates are arranged adjacent to each other, and an electronic device having such faceplates.

An aspect of the present invention is directed to a faceplate that is attached to a circuit board on the side of an extraction direction opposite to an insertion direction in which the circuit board is inserted into a slot. The faceplate includes: a main body configured to cover an opening of the slot when the circuit board is inserted in the slot; and two handle portions that are disposed respectively at both ends of the main body in a width direction of the circuit board and that extend in the extraction direction. The two handle portions have respective distal ends shifted from each other in a thickness direction of the circuit board.

Another aspect of the present invention is directed to an electronic device including a casing having formed therein at least two slots into each of which a circuit board is inserted along an insertion direction. The at least two slots are formed in the casing such that openings of the slots are positioned adjacent to each other in a width direction of the circuit boards. The electronic device further includes faceplates that are attached respectively to the circuit boards on the side of an extraction direction opposite to the insertion direction, and the faceplates each include a main body configured to cover the opening of the slot when the circuit board is inserted in the slot, and two handle portions that are disposed respectively at both ends of the main body in the width direction and that extend in the extraction direction. The two handle portions of each of two of the faceplates adjacent to each other in the width direction have respective distal ends shifted from each other in a thickness direction of the circuit board, and the distal end of one handle portion, of one faceplate of the faceplates, that is located closer to the other faceplate of the faceplates, and the distal end of one handle portion, of the other faceplate, that is located closer to the one faceplate, are shifted from each other in the thickness direction.

Thus, the present invention provides a faceplate that has handle portions that can be easily held even if multiple faceplates are arranged adjacent to each other, and also provides an electronic device having such faceplates.

The above and other objects, features, and advantages of the present invention will become more apparent from the following description when taken in conjunction with the accompanying drawings, in which a preferred embodiment of the present invention is shown by way of illustrative example.

BRIEF DESCRIPTION OF THE DRAWINGS

FIG. 3 is a side view of the faceplate of the embodiment;

FIG. 4 is a second perspective view of the electronic device of the embodiment;

FIG. 5 is a perspective view of an electronic device with faceplates attached thereto;

FIG. 6A is a side view of a faceplate according to a first modification, and FIG. 6B is a side view of another faceplate of the first modification;

DESCRIPTION OF THE PREFERRED EMBODIMENTS

Figure 1:
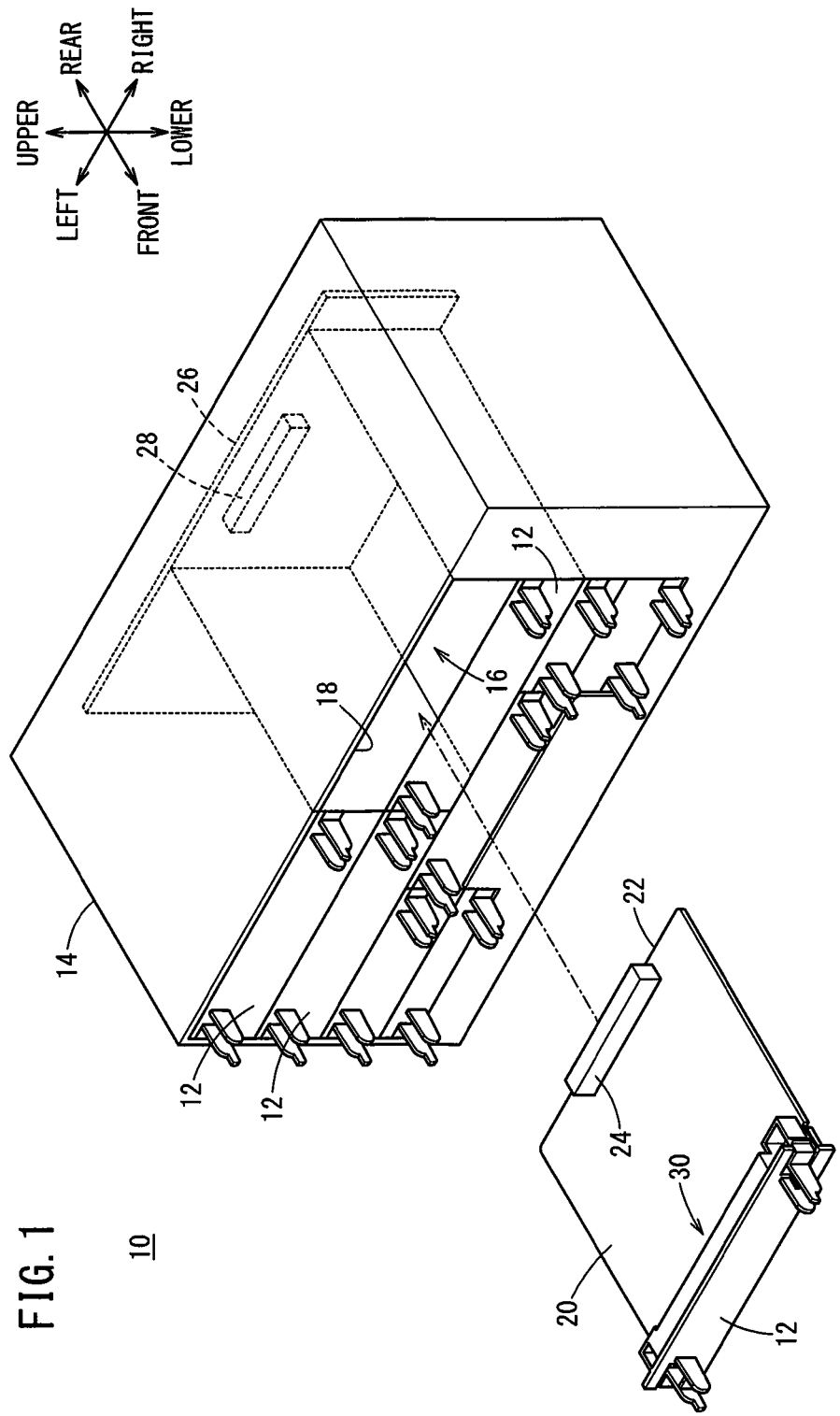
FIG. 1 is a first perspective view illustrating an electronic device according to an embodiment.

The present invention will now be described in detail referring to the accompanying drawings in conjunction with preferred embodiments. Directions will hereinafter be designated according to the arrows in the drawings.

Embodiment

FIG. 1 is a first perspective view illustrating an electronic device 10 according to an embodiment.

The electronic device 10 of this embodiment can be a numerical control device having computing functions, for example. The electronic device 10 includes a casing 14, a plurality of slots 16 formed in the casing 14, faceplates 12 that are attached to the casing 14 to cover openings 18 of the slots 16, and circuit boards 20 to which the faceplates 12 are attached.

As shown in FIG. 1, the plurality of slots 16 are arranged in the casing 14 such that two or more slots 16 adjoin each other in the right-left direction. As shown in FIG. 1, in this embodiment, each opening 18 is formed in a rectangular shape as seen from the forward side of the casing 14. A circuit board 20 can be inserted into each of the multiple slots 16 through the opening 18 along the rearward direction (insertion direction).

The circuit boards 20 may be printed circuit boards having certain electric circuits formed thereon, for example. Each circuit board 20 has a given width along the right-left direction (width direction) and a given thickness along the upper-lower direction (thickness direction). The circuit board 20 has a first connector 24 formed at its end 22 on the rear side. The first connector 24 is connected to a second connector 28 of a backboard 26 that is disposed at the rear end (the back) of the slot 16 inside the casing 14. The circuit board 20 inserted in the slot 16 can also be extracted out of the slot 16 along the frontward direction (extraction direction) opposite to the rearward direction.

The above-mentioned faceplate 12 is attached to an end 30 of the circuit board 20 on the front side. Thus, the faceplate 12 can cover the opening 18 of the slot 16 at almost the same time as the circuit board 20 is connected to the backboard 26.

Figure 2A:
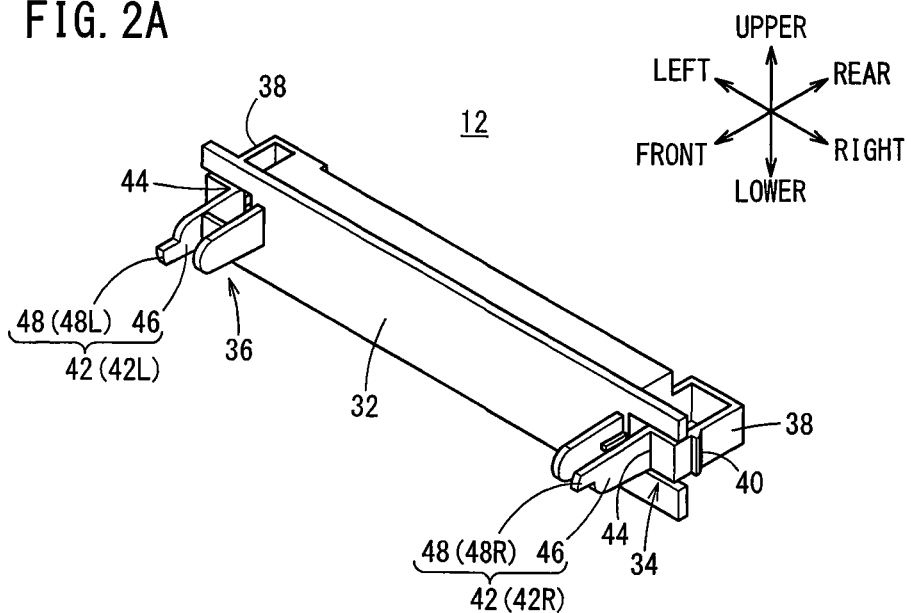
FIG. 2A is a perspective view of a faceplate of the embodiment.
Figure 2B:
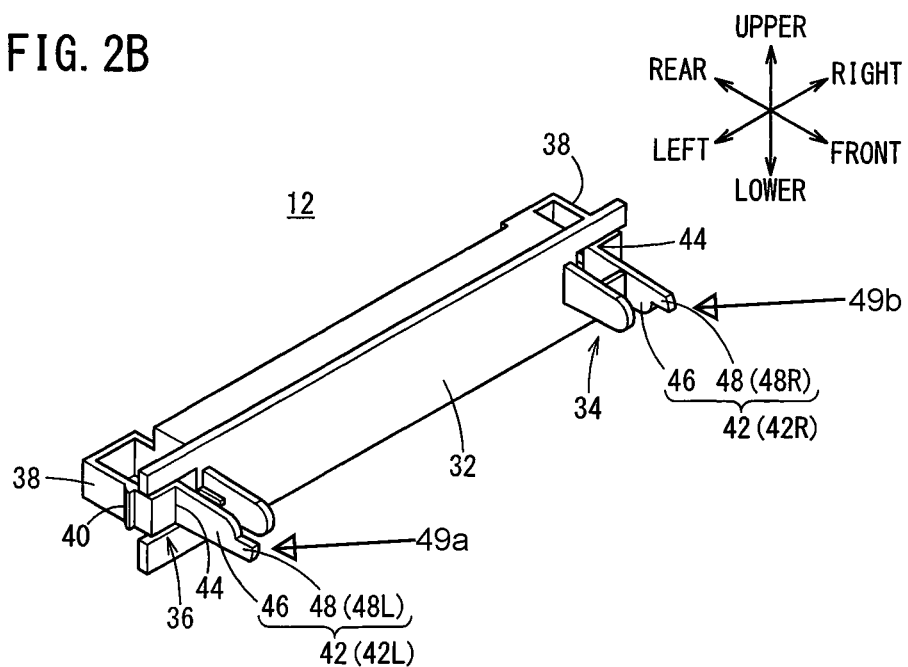
FIG. 2B shows the faceplate of FIG. 2A seen from another direction.

FIG. 2A is a perspective view of the faceplate 12 of the embodiment. FIG. 2B shows the faceplate 12 of FIG. 2A seen from another direction.

The faceplate 12 of this embodiment includes a main body 32 that covers the opening 18 of the slot 16 when the circuit board 20 is inserted in the slot 16, and engagement members 38 that are disposed at both ends of the main body 32 in the right-left direction and are engaged with the slot 16.

As shown in FIGS. 2A and 2B, the main body 32 is a rectangular, plate-shaped member. It is preferred that the shape of the main body 32 thus corresponds to the shape of the opening 18.

Each engagement member 38 has an engagement portion 40 that engages with the slot 16. The engagement portion 40 of this embodiment is a raised portion that is engaged into a recessed portion (not shown) formed in the slot 16. The faceplate 12 can keep covering the opening 18 of the slot 16 as the engagement portions 40 and slot 16 engage together. This prevents the circuit board 20 from falling off the slot 16. The engagement members 38 have flexibility and elasticity such that they can elastically bend in the right-left direction. The engagement portions 40 can then move in the right-left direction.

Each faceplate 12 has two handle portions 42 that are respectively disposed at both ends 34, 36 of the main body 32 in the right-left direction so as to extend in the frontward direction. In this embodiment, the end 34 is a part of the main body 32 that is disposed relatively to the right and the end 36 is a part of the main body 32 that is disposed relatively to the left. Each handle portion 42 includes a flexible support portion 46 provided on the main body 32 so as to extend from a proximal end 44 of the handle portion 42 in a direction parallel to the frontward direction, and a distal end 48 that is supported by the support portion 46 and directed in a direction parallel to the frontward direction. Hereinafter, the "handle portion 42 on the right side" of the two handle portions 42 of the faceplate 12 will also be referred to as "handle portion 42R" and the "handle portion 42 on the left side" will also be referred to as "handle portion 42L". The "distal end 48 of the handle portion 42R" will also be referred to as "distal end 48R" and the "distal end 48 of the handle portion 42L" will also be referred to as "distal end 48L".

FIG. 3 is a side view of the faceplate 12 of the embodiment. FIG. 3 shows part of the faceplate 12 seen from the left side.

The handle portion 42R and the handle portion 42L are formed such that their respective proximal ends 44 are located at the same position in the upper-lower direction. However, the distal end 48R and the distal end 48L are arranged at positions that are shifted off each other in the upper-lower direction. In the example of FIG. 3, the distal end 48R is displaced upward relative to the distal end 48L, and the distal end 48L is displaced downward relative to the distal end 48R. Thus, when attempting to hold the two handle portions 42 of the faceplate 12, the operator can hold the two distal ends 48 that are shifted from each other in the upper-lower direction. The distal end 48R may be displaced downward relative to the distal end 48L, and the distal end 48L may be displaced upward relative to the distal end 48R.

The operator holds the two handle portions 42 of the faceplate 12 when removing the faceplate 12 and circuit board 20 from the slot 16, for example. In this way, the handle portions 42 function as so-called "handles". Specifically, in a state where the faceplate 12 and slot 16 is disengaged, the operator holds and pulls the handle portions 42 of the faceplate 12 frontward. The faceplate 12 and circuit board 20 can thus be easily removed from the slot 16.

In this embodiment, the handle portions 42 are attached to the engagement members 38 respectively at both ends 34, 36 of the main body 32. In this embodiment, the handle portions 42 have flexibility. Accordingly, the handle portions 42 can move in the right-left direction within the allowable range of its flexibility. The engagement members 38 also have flexibility and so can move in the same direction as the handle portions 42 move. Thus, in this embodiment, the handle portions 42 is moved in directions for releasing the slot 16 and the engagement members 38 from the engagement state therebetween, whereby it is possible to move the engagement members 38 in the directions for releasing the slot 16 and the engagement members 38 from the engagement state.

The "directions for releasing" means such directions that the engagement portions 40 of the engagement members 38 are separated away from the slot 16. For example, at the right-side end 34 of the main body 32, the engagement portion 40 is moved away from the slot 16 when the engagement member 38 is moved to the left. Accordingly, the "direction for releasing" for the handle portion 42R is "direction to the left". Similarly, the "direction for releasing" for the handle portion 42L is "direction to the right".

The operator can move the handle portions 42 and engagement members 38 in the directions for releasing by holding the handle portions 42. Hence, the operator can easily release the slot 16 and the engagement portions 40 from the engagement state by holding the handle portions 42. Furthermore, by pulling the faceplate 12 frontward in this state, the operator can easily remove the faceplate 12 off from the slot 16 as mentioned above. In this way, the faceplate 12 of the embodiment makes it possible for the operator to easily remove the faceplate from the slot 16.

Moreover, in this embodiment, the proximal ends 44 of the handle portion 42R and the handle portion 42L are located at the same position in the upper-lower direction. This arrangement makes it easy to apply equal forces to the handle portion 42R and the handle portion 42L when the operator removes the faceplate 12 while holding the handle portion 42R with the right hand and the handle portion 42L with the left hand.

FIG. 4 is a second perspective view showing the electronic device 10 of this embodiment.

FIG. 4 shows an example of the electronic device 10 where the circuit board 20 equipped with the above-described faceplate 12 has been inserted in the slot 16. For convenience, among the multiple faceplates 12 shown in FIG. 4, two faceplates 12 that adjoin each other in the left and right direction will be referred to as faceplate 12A and faceplate 12B, respectively. The faceplate 12 located relatively to the left is the faceplate 12A and that to the right is the faceplate 12B. As can be seen from FIG. 4, concerning the faceplate 12A and the faceplate 12B, the handle portion 42R of the faceplate 12A and the handle portion 42L of the faceplate 12B are adjacent to each other.

FIG. 5 is a perspective view of an electronic device 10' equipped with faceplates 12'.

Now, faceplates 12' (faceplate 12A', faceplate 12B') and an electronic device 10' that includes the faceplates 12' will be described, where the distal ends 48 of the two handle portions 42 are not shifted from each other in the upper-lower direction (i.e., the distal ends are arranged at the same positions in the upper-lower direction). Note that the electronic device 10' and faceplates 12' have the same configurations as the electronic device 10 and faceplates 12 except that the distal ends 48 of the two handle portions 42 are not shifted off each other in the upper-lower direction. Accordingly, in the electronic device 10', in a case where the faceplate 12A' and the faceplate 12B' are adjacent in the right-left direction, the handle portion 42R of the faceplate 12A' and the handle portion 42L of the faceplate 12B' adjoin each other.

The operator can remove the faceplate 12A' from the slot 16 by holding and pulling both the handle portion 42R and the handle portion 42L of the faceplate 12A'. However, if the casing 14 of the electronic device 10' is small-sized, for example, the handle portion 42R of the faceplate 12A' and the handle portion 42L of the faceplate 12B' may be positioned extremely close to each other. Even when the casing 14 of the electronic device 10' is not small-sized, the handle portion 42R of the faceplate 12A' and the handle portion 42L of the faceplate 12B' may be placed close to each other if the slots 16 are formed densely. In such a case, the handle portion 42L of the faceplate 12B' will interfere when the operator attempts to hold the handle portion 42R of the faceplate 12A'. As a result, the operator cannot easily remove the faceplate 12A' from the electronic device 10'. In this way, the electronic device 10' has the drawback that the work of removing the faceplate 12A' or faceplate 12B' is difficult if the faceplate 12A' and the faceplate 12B' are adjacent to each other.

Returning to this embodiment (FIG. 4), the operator can hold the distal end 48R of the faceplate 12A that is shifted upward relative to the distal end 48L when removing the faceplate 12A from the slot 16. At this time, the distal end 48L of the faceplate 12B that is adjacent to the faceplate 12A in the right-left direction is shifted downward relative to the distal end 48R. Accordingly, the distal end 48L of the faceplate 12B is less obstructive when the operator holds the distal end 48R of the faceplate 12A. In this way, according to the faceplate 12 of this embodiment, the operator can easily hold the distal end 48R of the handle portion 42R of one faceplate 12A of the adjacent two, while avoiding the handle portion 42L of the other faceplate 12B.

The description above is of course applicable not only to the faceplate 12A and the faceplate 12B shown in FIG. 4 but also to any sets of two faceplates 12 that are adjacent to each other in the right-left direction.

Though not described above, guide rails for guiding the circuit boards 20 in the front-rear direction may be provided in the slots 16 of the casing 14. This enables easy insertion and extraction of the circuit boards 20 into and from the slots 16.

Further, though not described above, the circuit board 20 may be provided with a connecting terminal formed at its end 30 on the front side, for example, for the purpose of external connection. In this case, an opening for the terminal, for exposing the connecting terminal on the front side, may be provided in a portion of the main body 32 of the faceplate 12 that faces the connecting terminal. It is then possible to electrically connect the connecting terminal and equipment other than the electronic device 10 through this opening of the main body 32, with the circuit board 20 inserted in the slot 16.

[Modifications]

The embodiment has been described as an example of the present invention and the above-described embodiment can of course be modified or improved in various manners. It is clear from recitation of claims that such modified or improved embodiments are also included in the technical scope of the present invention.

(First Modification)

FIG. 6A is a side view of a faceplate 12 according to a first modification. FIG. 6B is a side view of another faceplate 12 of the first modification.

The distal end 48R and the distal end 48L may be modified to be directed in different directions from those of the embodiment. For example, the distal end 48R may extend obliquely so as to be directed frontward and toward one side in the upper-lower direction, while the distal end 48L may extend obliquely so as to be directed frontward and toward the other side in the upper-lower direction.

FIG. 6A shows an example in which the distal end 48R extends obliquely frontward and upward and the distal end 48L extends obliquely frontward and downward. Alternately, the distal end 48R may extend obliquely frontward and downward, and the distal end 48L may extend obliquely frontward and upward.

In another embodiment of this modification, the distal end 48R may extend in parallel to the upper-lower direction and toward one side in the upper-lower direction, while the distal end 48L may extend in parallel to the upper-lower direction and toward the other side in the upper-lower direction.

FIG. 63 shows an example in which the distal end 48R extends upward in the upper-lower direction, and the distal end 48L extends downward in the upper-lower direction. The distal end 48R may extend downward in the upper-lower direction, and the distal end 48L may extend upward in the upper-lower direction.

In this way, in this modification, the distal end 48R and the distal end 48L are directed respectively toward one side and the other side in the upper-lower direction. This configuration further reduces the likelihood that, with two faceplates 12 adjacent in the right-left direction, the handle portion 42L of the faceplate 12 on the relatively right side interferes when the operator attempts to hold the distal end 48R of the faceplate 12 on the relatively left side. In the same way, this also further reduces the likelihood that the handle portion 42R of the faceplate 12 on the relatively left side interferes when the operator attempts to hold the distal end 48L of the faceplate 12 on the relatively right side.

(Second Modification)

Figure 7A:
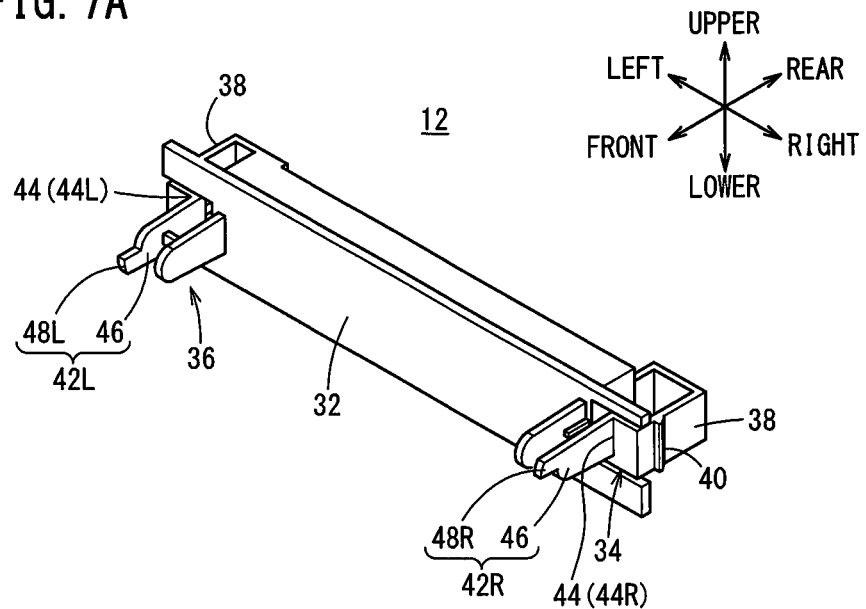
FIG. 7A is a perspective view of a faceplate according to a second modification.
Figure 7B:
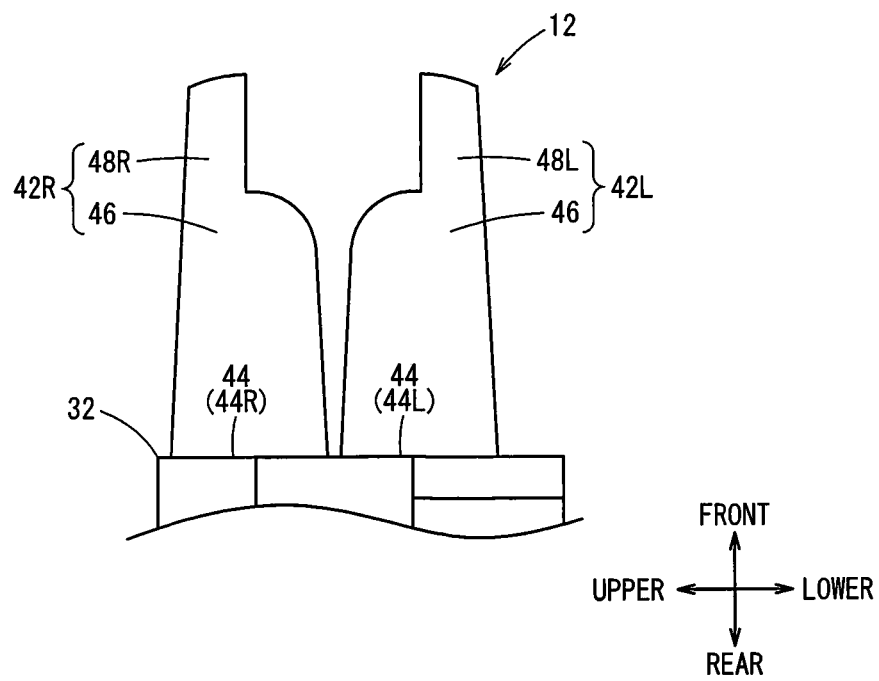
FIG. 7B shows the faceplate of FIG. 7A seen from another direction (a side view)

FIG. 7A is a perspective view of a faceplate 12 according to a second modification. FIG. 7B shows the faceplate 12 of FIG. 7A seen from another direction (a side view).

In the embodiment above, the proximal ends 44 of two handle portions 42 are located at the same position in the upper-lower direction. The proximal ends 44 of the two handle portions 42 may be shifted from each other in the upper-lower direction. FIGS. 7A and 7B show an example in which the proximal end 44 (proximal end 44R) of the handle portion 42R is shifted upward relative to the proximal end 44L and the proximal end 44 (proximal end 44L) of the handle portion 42L is shifted downward relative to the proximal end 44R. The proximal end 44R may be shifted relatively downward and the proximal end 44L may be shifted relatively upward.

This configuration further reduces the likelihood that, with two faceplates 12 adjacent in the right-left direction, the handle portion 42L of the faceplate 12 on the relatively right side interferes when the operator attempts to hold the handle portion 42R of the faceplate 12 on the relatively left side. In the same way, this also further reduces the likelihood that the handle portion 42R of the faceplate 12 on the relatively left side interferes when the operator attempts to hold the handle portion 42L of the faceplate 12 on the relatively right side.

(Third Modification)

Figure 8A:
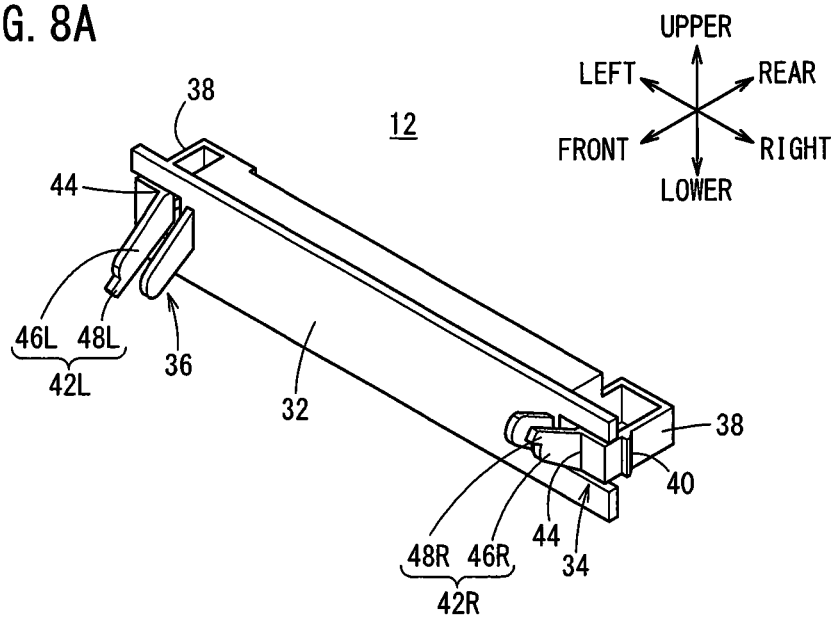
FIG. 8A is a perspective view of a faceplate according to a third modification.
Figure 8B:
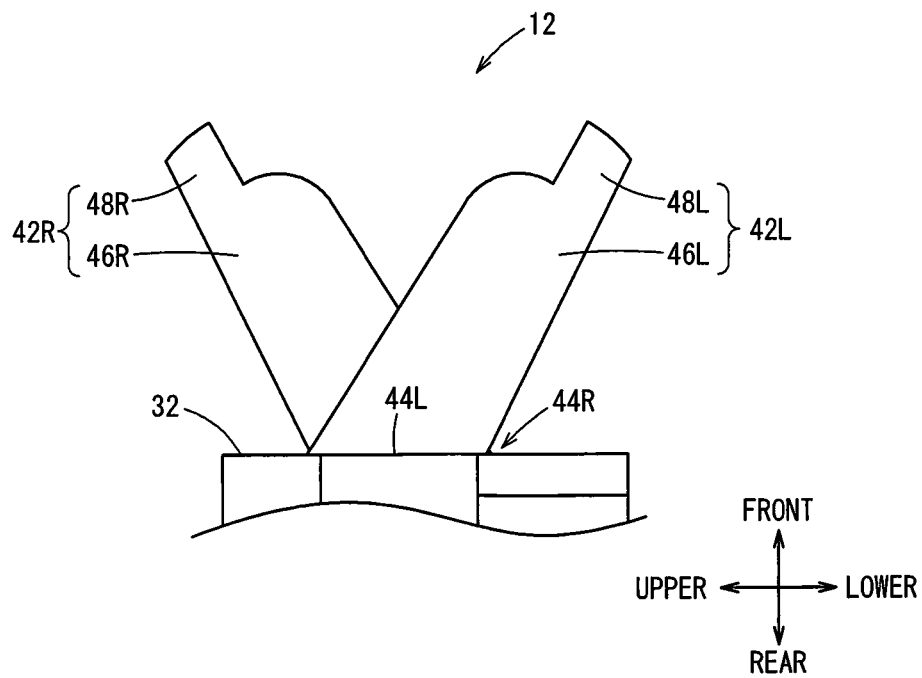
FIG. 8B shows the faceplate of FIG. 8A seen from another direction (a side view).

FIG. 8A is a perspective view of a faceplate 12 according to a third modification. FIG. 8B shows the faceplate 12 of FIG. 8A seen from another direction (a side view).

The embodiment above has illustrated an implementation where the support portion 46 of the handle portion 42R and the support portion 46 of the handle portion 42L both extend in a direction parallel to the frontward direction. The support portion 46 (support portion 46R) of the handle portion 42R may extend obliquely from the proximal end 44 of the handle portion 42R so as to be directed frontward and toward one side in the upper-lower direction. Also, the support portion 46 (support portion 46L) of the handle portion 42L may extend obliquely from the proximal end 44 of the handle portion 42L so as to be directed frontward and toward the other side in the upper-lower direction.

In FIGS. 8A and 8B, in the handle portion 42R, the support portion 46R extends obliquely from the proximal end 44R toward the front and upper side. Also, in FIGS. 8A and 8B, in the handle portion 42L, the support portion 46L extends obliquely from the proximal end 44L toward the front and lower side. Alternately, the support portion 46R may extend obliquely from the proximal end 44R toward the front and lower side, while the support portion 46L may extend obliquely from the proximal end 44L toward the front and upper side.

In applications of this modification, the directions of the distal ends 48 can be appropriately changed. FIGS. 8A and 8B show an example in which the distal end 48R is directed in the same direction as the support portion 46R, i.e., extending obliquely toward the front and upper side, and the distal end 48L is directed in the same direction as the support portion 46L, i.e., extending obliquely toward the front and lower side. This configuration may be changed for example so that, as in the embodiment above, the distal end 48R and the distal end 48L are directed in a direction parallel to the frontward direction. Alternatively, for example, as in the second example of the first modification, the distal end 48R and the distal end 48L may be formed so that the distal end 48R is directed in a direction parallel to the upward direction and the distal end 48L is directed in a direction parallel to the downward direction.

This configuration further reduces the likelihood that, with two faceplates 12 adjacent in the right-left direction, the handle portion 42L of the faceplate 12 on the relatively right side interferes when the operator attempts to hold the handle portion 42R of the faceplate 12 on the relatively left side. In the same way, this also further reduces the likelihood that the handle portion 42R of the faceplate 12 on the relatively left side interferes when the operator attempts to hold the handle portion 42L of the faceplate 12 on the relatively right side.

(Fourth Modification)

The embodiments and modifications described above can be appropriately combined together without incurring contradictions.

Invention Obtained from Embodiments

The invention obtainable from the embodiments and modifications above will be recited below.

<First Invention>

A first invention provides the faceplate (12) that is attached to a circuit board (20) on the side of an extraction direction opposite to an insertion direction in which the circuit board (20) is inserted into a slot (16). The faceplate includes: a main body (32) configured to cover an opening (18) of the slot (16) when the circuit board (20) is inserted in the slot (16); and two handle portions (42) that are disposed respectively at both ends (34, 36) of the main body (32) in a width direction of the circuit board (20) and that extend in the extraction direction. The two handle portions (42) have respective distal ends (48) with main faces (49*a*, 49*b*) that extend in the extraction direction. The main faces (49*a*, 49*b*) are shifted from each other in a thickness direction of the circuit board (20).

With this configuration, it is possible to provide a faceplate (12) which, even when multiple faceplates (12) are disposed adjacent to each other, makes it easy to hold the distal ends (48) of the handle portions (42) while avoiding the handle portions (42) of other faceplates (12) adjacent thereto.

The distal ends (48) of the two handle portions (42) may be directed in a direction parallel to the extraction direction. Thus, when holding the two handle portions (42) of the faceplate (12), the operator can hold the two distal ends (48) that are shifted off each other in the thickness direction and extend in parallel with the extraction direction.

The distal end (48) of one of the two handle portions (42) may extend obliquely so as to be directed in the extraction direction and toward one side in the thickness direction, and the distal end (48) of the other of the two handle portions (42) may extend obliquely so as to be directed in the extraction direction and toward the other side in the thickness direction. Thus, even when two faceplates (12) are placed adjacent to each other in the width direction, the distal ends (48) of the handle portions (42) of one of the two faceplates (12) can be held more easily.

The distal end (48) of one of the two handle portions (42) may extend in parallel with the thickness direction and toward one side in the thickness direction, and the distal end (48) of the other of the two handle portions (42) may extend in parallel with the thickness direction and toward the other side in the thickness direction. Thus, even when two faceplates (12) are placed adjacent to each other in the width direction, the distal ends (48) of the handle portions (42) of one of the two faceplates (12) can be held more easily.

The two handle portions (42) may have respective proximal ends (44) positioned at the same position in the thickness direction. This allows the operator to easily apply equal forces to the two handle portions (42).

One handle portion of the two handle portions (42) may extend obliquely from a proximal end (44) of the one handle portion (42) so as to be directed in the extraction direction and toward one side in the thickness direction, and the other handle portion of the two handle portions (42) may extend obliquely from a proximal end (44) of the other handle portion (42) so as to be directed in the extraction direction and toward the other side in the thickness direction. Thus, even when two faceplates (12) are placed adjacent to each other in the width direction, the handle portions (42) of one of the two faceplates (12) can be held more easily.

The faceplate (12) may further include engagement members (38) configured to engage with the slot (16) at both ends of the main body (32), and the handle portions (42) may be attached respectively to the engagement members (38). The handle portions (42) may be configured to release the slot (16) and the engagement members (38) from the engagement state therebetween when the handle portions (42) move in directions for releasing the slot (16) and the engagement members (38) from the engagement state therebetween. Thus, the operator can easily remove the faceplate (12) from the slot (16).

<Second Invention>

A second invention provides the electronic device (10) including a casing (14) having formed therein at least two slots (16) into each of which a circuit board (20) is inserted along an insertion direction. The at least two slots (16) are formed in the casing (14) such that openings (18) of the slots (16) are positioned adjacent to each other in a width direction of the circuit boards (20). The electronic device (10) further includes faceplates (12) that are attached respectively to the circuit boards (20) on the side of an extraction direction opposite to the insertion direction, and the faceplates (12) each include a main body (32) configured to cover the opening (18) of the slot (16) when the circuit board (20) is inserted in the slot (16), and two handle portions (42) that are disposed respectively at both ends (34, 36) of the main body (32) in the width direction and that extend in the extraction direction. The two handle portions (42) of each of two of the faceplates (12) adjacent to each other in the width direction have respective distal ends (48) shifted from each other in a thickness direction of the circuit board (20), and the distal end (48) of one handle portion (42), of one face plate (12A) of the faceplates, that is located closer to the other faceplate (12B) of the faceplates, and the distal end (48) of one handle portion (42), of the other faceplate (12B), that is located closer to the one faceplate (12A), are shifted from each other in the thickness direction.

With this configuration, it is possible to provide an electronic device (10) which, even when multiple faceplates (12A, 12B) are disposed adjacent to each other, makes it easy to hold the distal ends (48) of the handle portions (42) of one faceplate (12A) while avoiding the handle portions (42) of the other faceplate (12B).

According to the second invention, the distal ends (48) of the two handle portions (42) of each of the faceplates (12) may be directed in a direction parallel to the extraction direction. Thus, when holding the two handle portions (42) of the faceplate (12), the operator can hold the two distal ends (48) that are shifted off each other in the thickness direction and extend in parallel with the extraction direction.

According to the second invention, the distal end (48) of one of the two handle portions (42) of each of the faceplates (12) may extend obliquely so as to be directed in the extraction direction and toward one side in the thickness direction, and the distal end (48) of the other of the two handle portions (42) may extend obliquely so as to be directed in the extraction direction and toward the other side in the thickness direction. Thus, even when two faceplates (12) are placed adjacent to each other in the width direction, the distal ends (48) of the handle portions (42) of one of the two faceplates (12) can be held more easily.

According to the second invention, in each of the faceplates (12), the distal end (48) of one of the two handle portions (42) may extend in parallel with the thickness direction and toward one side in the thickness direction, and the distal end (48) of the other of the two handle portions (42) may extend in parallel with the thickness direction and toward the other side in the thickness direction. Thus, even when two faceplates (12) are placed adjacent to each other in the width direction, the distal ends (48) of the handle portions (42) of one of the two faceplates (12) can be held more easily.

According to the second invention, the two handle portions (42) of each of the faceplates (12) may have respective proximal ends (44) positioned at the same position in the thickness direction. This allows the operator to easily apply equal forces to the two handle portions (42).

According to the second invention, in each of the faceplates (12), one handle portion of the two handle portions (42) may extend obliquely from a proximal end (44) of the one handle portion (42) so as to be directed in the extraction direction and toward one side in the thickness direction, and the other handle portion of the two handle portions (42) may extend obliquely from a proximal end (44) of the other handle portion (42) so as to be directed in the extraction direction and toward the other side in the thickness direction. Thus, even when two faceplates (12) are placed adjacent to each other in the width direction, the handle portions (42) of one of the two faceplates (12) can be held more easily.

According to the second invention, each of the faceplates (12) may further include engagement members (38) configured to engage with the slot (16) at both ends of the main body (32), and the handle portions (42) may be attached respectively to the engagement members (38). The handle portions (42) may be configured to release the slot (16) and the engagement members (38) from the engagement state therebetween when the handle portions (42) move in directions for releasing the slot (16) and the engagement members (38) from the engagement state therebetween. Thus, the operator can easily remove the faceplate (12) from the slot (16).

What is claimed is:

1. A faceplate that is attached to a circuit board on a side of an extraction direction opposite to an insertion direction in which the circuit board is inserted into a slot, the faceplate comprising:
    a main body covers an opening of the slot when the circuit board is inserted in the slot; and
    two handle portions that are connected respectively at both ends of the main body in a width direction of the circuit board and that extend in the extraction direction from the both ends,
    wherein the two handle portions have respective distal ends with main faces that extend in the extraction direction, the main faces being shifted from each other in a thickness direction of the circuit board.

2. The faceplate according to claim 1, wherein the main faces of the distal ends of the two handle portions are directed in a direction parallel to the extraction direction.

3. The faceplate according to claim 1, wherein
    the main face of the distal end of one of the two handle portions extends obliquely so as to be directed in the extraction direction and toward one side in the thickness direction, and
    the main face of the distal end of another of the two handle portions extends obliquely so as to be directed in the extraction direction and toward another side in the thickness direction.

4. The faceplate according to claim 1, wherein
the main face of the distal end of one of the two handle portions extends in parallel with the thickness direction and toward one side in the thickness direction, and
the main face of the distal end of another of the two handle portions extends in parallel with the thickness direction and toward another side in the thickness direction.

5. The faceplate according to claim 1, wherein the two handle portions have respective proximal ends positioned at a same position in the thickness direction.

6. The faceplate according to claim 1, wherein
one handle portion of the two handle portions extends obliquely from a proximal end of the one handle portion so as to be directed in the extraction direction and toward one side in the thickness direction, and
another handle portion of the two handle portions extends obliquely from a proximal end of the other handle portion so as to be directed in the extraction direction and toward another side in the thickness direction.

7. The faceplate according to claim 1, further comprising engagement members that engage with the slot at the both ends of the main body, wherein the handle portions are attached respectively to the engagement members, and
the handle portions are configured to release the slot and the engagement members from an engagement state therebetween when the handle portions move in directions for releasing the slot and the engagement members from the engagement state therebetween.

8. The faceplate according to claim 1, wherein the two handle portions each include a proximal end connected respectively at the both ends of the main body, the two handle portions each having a length extending in the extraction direction from the proximal end to the main face of the respective distal end of one of the two handle portions.

9. An electronic device including a casing having formed therein a first and a second slot into each of which a circuit board is inserted along an insertion direction, wherein the first and second slots are formed in the casing so that a first opening of the first slot and a second opening of the second slot are positioned adjacent to each other in a width direction of the circuit boards; and
wherein the electronic device further comprises first and second faceplates that are attached respectively to the circuit boards on a side of an extraction direction opposite to the insertion direction;
the first and second faceplates each include:
a main body that covers the respective first and second openings of the respective first and second slots when the circuit boards are inserted in the respective first and second slots; and
two handle portions that are connected respectively at both ends of the main body in the width direction and that extend in the extraction direction from the both ends, and
the two handle portions of each of the first and second faceplates adjacent to each other in the width direction have respective distal ends with main faces that extend in the extraction direction, the main faces being shifted from each other in a thickness direction of the respective circuit board, and the main face of the respective distal end of a first handle portion of the two handle portions of the first faceplate that is located closer to the second faceplate than is a second handle portion of the two handle portions of the first faceplate, and the main face of the respective distal end of a first handle portion of the two handle portions of the second faceplate that is located closer to the first faceplate than is a second handle portion of the two handle portions of the second faceplate, are shifted from each other in the thickness direction.

10. The electronic device according to claim 9, wherein the main faces of the respective distal ends of the two handle portions of each of the first and second faceplates are directed in a direction parallel to the extraction direction.

11. The electronic device according to claim 9, wherein
the main face of the distal end of one of the two handle portions of each of the faceplates extends obliquely so as to be directed in the extraction direction and toward one side in the thickness direction, and
the main face of the distal end of another of the two handle portions extends obliquely so as to be directed in the extraction direction and toward another side in the thickness direction.

12. The electronic device according to claim 9, wherein, in each of the faceplates,
the main face of the distal end of one of the two handle portions extends in parallel with the thickness direction and toward one side in the thickness direction, and
the main face of the distal end of another of the two handle portions extends in parallel with the thickness direction and toward another side in the thickness direction.

13. The electronic device according to claim 9, wherein the two handle portions of each of the first and second faceplates have respective proximal ends positioned at a same position in the thickness direction.

14. The electronic device according to claim 9, wherein, in each of the faceplates,
one handle portion of the two handle portions extends obliquely from a proximal end of the one handle portion so as to be directed in the extraction direction and toward one side in the thickness direction, and
another handle portion of the two handle portions extends obliquely from a proximal end of the other handle portion so as to be directed in the extraction direction and toward another side in the thickness direction.

15. The electronic device according to claim 9, wherein each of the first and second faceplates further includes two engagement members that engage with the respective first and second slots at the both ends of the main body,
the two handle portions of each of the respective first and second faceplates are attached respectively to the two engagement members, and
the two handle portions of each of the respective first and second faceplates are configured to release the respective first and second slots and the respective two engagement members from an engagement state therebetween when the two handle portions of the respective first and second faceplates move in directions for releasing the respective first and second slots and the respective two engagement members from the engagement state therebetween.

* * * * *